United States Patent
Huang

(10) Patent No.: US 11,638,387 B2
(45) Date of Patent: Apr. 25, 2023

(54) DISPLAY APPARATUS

(71) Applicant: SEEYA OPTRONICS CO., LTD., Shanghai (CN)

(72) Inventor: Zhongshou Huang, Shanghai (CN)

(73) Assignee: SEEYA OPTRONICS CO., LTD., Shanghai (CN)

( * ) Notice: Subject to any disclaimer, the term of this patent is extended or adjusted under 35 U.S.C. 154(b) by 231 days.

(21) Appl. No.: 17/123,607

(22) Filed: Dec. 16, 2020

(65) Prior Publication Data

US 2022/0037426 A1 Feb. 3, 2022

(30) Foreign Application Priority Data

Jul. 29, 2020 (CN) .......................... 202010743667.6

(51) Int. Cl.
*H10K 59/35* (2023.01)

(52) U.S. Cl.
CPC ........... *H10K 59/353* (2023.02); *H10K 59/38* (2023.02)

(58) Field of Classification Search
CPC ............... H01L 27/3218; H01L 27/322; H01L 27/3211; H01L 27/3258; H01L 27/3213; H01L 27/3246; H01L 27/3262; H01L 51/5209; H01L 51/5225; H01L 27/3206
See application file for complete search history.

(56) References Cited

U.S. PATENT DOCUMENTS

| | | | |
|---|---|---|---|
| 2008/0024402 A1* | 1/2008 | Nishikawa | H05B 33/22 345/82 |
| 2017/0062769 A1* | 3/2017 | Kim | H01L 27/3246 |
| 2017/0324063 A1* | 11/2017 | Ohara | H01L 27/32 |
| 2019/0181382 A1* | 6/2019 | Guo | H01L 51/5265 |
| 2020/0185655 A1* | 6/2020 | Jo | H01L 51/5284 |
| 2020/0235178 A1* | 7/2020 | Shin | H01L 27/3223 |

* cited by examiner

*Primary Examiner* — Kevin Quarterman
(74) *Attorney, Agent, or Firm* — Duane Morris LLP

(57) ABSTRACT

An OLED display panel comprises a pixel array and a substrate. The pixel array includes a plurality of pixels, each of the pixel includes multiple sub-pixels. Each of the sub-pixels includes multiple layers stacked in processing sequence on the substrate, a driving circuit layer, an uneven surface layer, and a light-emitting layer. The uneven surface layer includes a plurality of concave-convex structures. In each pixel, there are at least two sub-pixels corresponding to different colors respectively, and possessing different numbers of concave-convex structures, respectively. Moreover, those sub-pixels corresponding to a same color in the pixel array possess a same number of concave-convex structures. The light-emitting layer conformal to the concave-convex structures has increased surface area, so that the effective light-emitting area of the display panel is increased and the brightness of the OLED display panel is enhanced accordingly.

13 Claims, 7 Drawing Sheets

DISPLAY APPARATUS

CROSS-REFERENCES TO RELATED APPLICATIONS

This application claims the priority to a Chinese patent application No. CN202010743667.6 filed Jul. 29, 2020, which is incorporated herein by reference in its entirety.

TECHNICAL FIELD

The present disclosure relates to the field of display apparatus and, in particular, to an OLED display panel.

BACKGROUND

In recent years, OLED display panels have gradually become the mainstream of display screen of mobile communication terminals. An OLED display panel includes a plurality of sub-pixels arranged in an array, where each sub-pixel includes a pixel driving circuit and a light-emitting element electrically connected to the pixel driving circuit.

As the resolution of a display panel increases, the dimensions of a sub-pixel and its light-emitting element have come to micrometer ranges. Due to manufacture process limitations, critical dimensions which represents minimum feature after processing, are unable to be scaled down as the shrinkage of the sub-pixel dimensions. As consequences, the light intensity per unit area from the display panel decreases with the shrinkage of the subpixel dimensions. In terms of lifetime of organic light emitting elements, it has been known that organic light emitting material in different colors usually have different attenuation rates during continuous operation, resulting in color shift on a display panel. It becomes the primary objectives of this disclosure to mitigate or overcome these drawbacks in an OLED display panel.

SUMMARY

A display panel is provided in the embodiments of the present disclosure to avoid the problem of color shift of a display panel and improve the display effect of the display panel.

A display panel is provided in the embodiments of the present disclosure and includes a substrate and a pixel array.

The pixel array is disposed on the substrate and the pixel array includes a plurality of pixels. Each of the plurality of pixels includes a plurality of sub-pixels, and each of the plurality of sub-pixels includes a driving circuit layer, an uneven surface layer, and a light-emitting layer stacked in sequence.

The uneven surface layer includes a plurality of concave-convex structures.

At least two sub-pixels in each of the plurality of pixels emit in different color, and possess different numbers of concave-convex structures. The sub-pixels with a same color in the pixel array possess a same number of concave-convex structures.

In the embodiments of the present disclosure, the concave-convex structures are configured in uneven surface layers of sub-pixels in different colors, so that the light-emitting area of the display panel is increased, and the brightness of the light-emitting layer is enhanced. Moreover, different numbers of concave-convex structures are configured in the uneven surface layers of sub-pixels in different colors, so that the problem of color shift of the display panel due to different attenuation rates of light-emitting layer in sub-pixels of different colors or different transmittance of different color filter layers in sub-pixels of different colors may be avoided.

DETAILED DESCRIPTION

Figure 1:
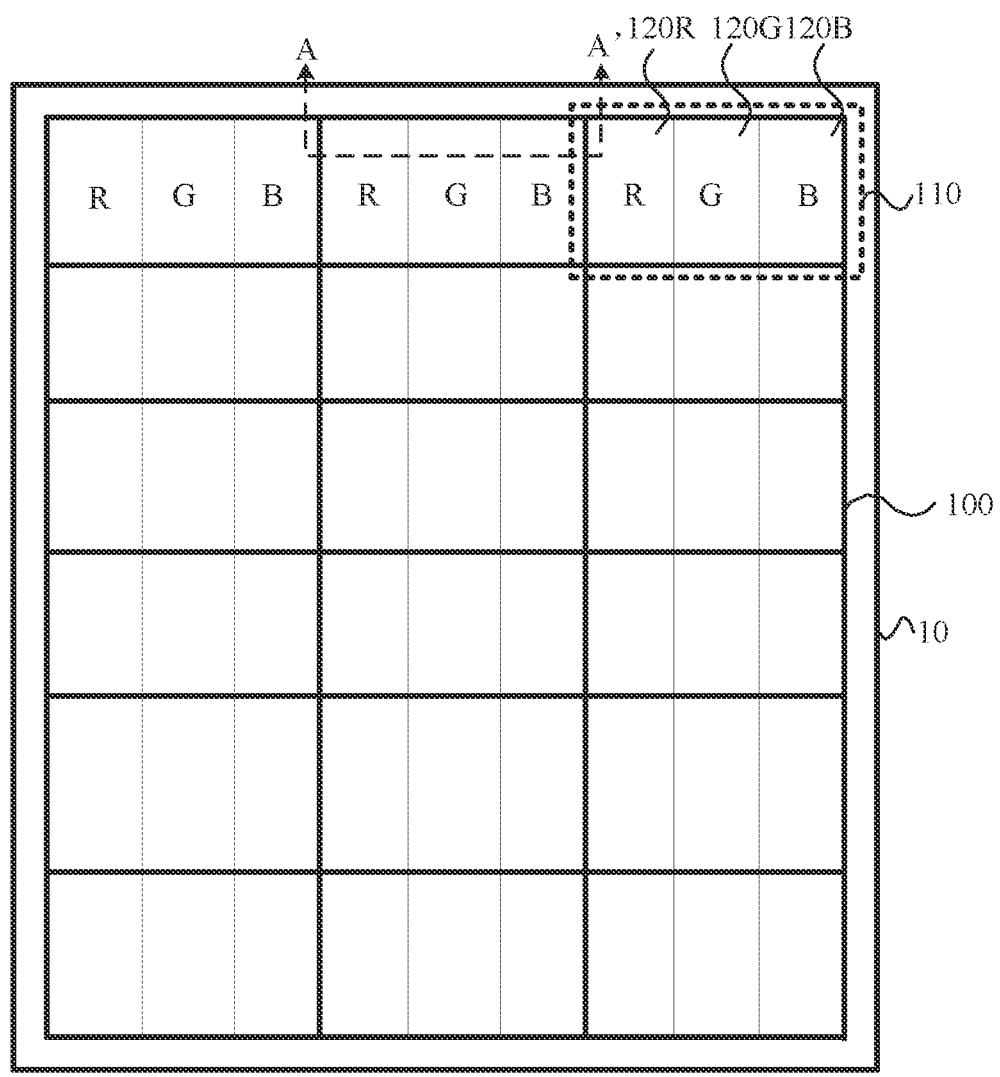
FIG. 1 shows a plane view of a display panel according to embodiments of the present disclosure.

Hereinafter the present disclosure is further described in detail in conjunction with the drawings and embodiments. It is to be understood that the embodiments set forth below are intended to illustrate and not to limit the present disclosure. Additionally, it is to be noted that for ease of description, only part, not all, of the structures related to the present disclosure are illustrated in the drawings.

Figure 2:
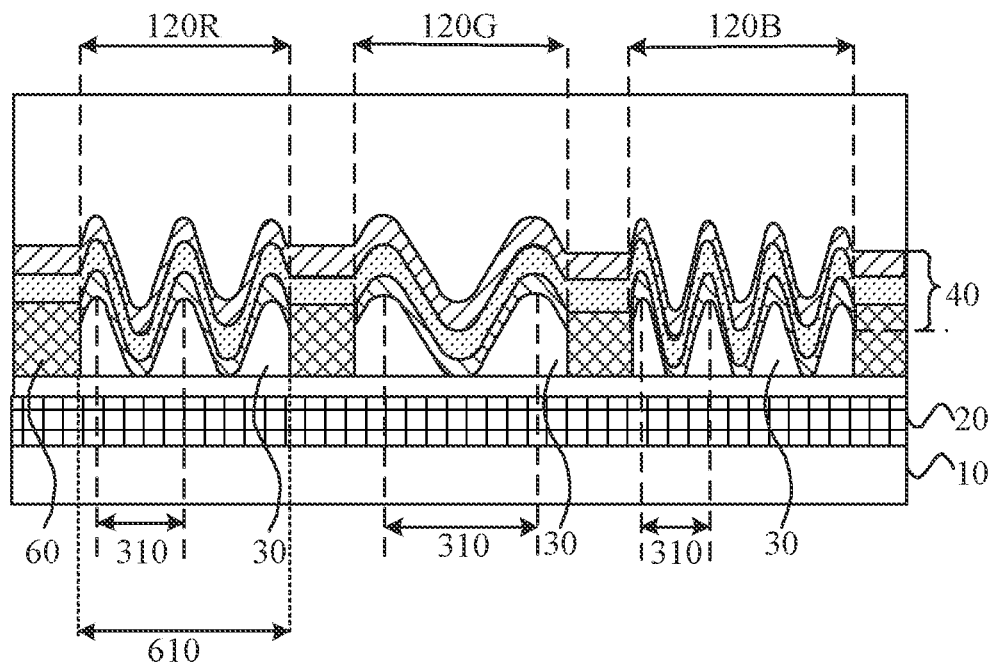
FIG. 2 illustrates a cross-sectional view of the display panel illustrated in FIG. 1 taken along a section line A-A'.

FIG. 1 shows a plane view of a display panel according to embodiments of the present disclosure, and FIG. 2 illustrates a cross-sectional view of the display panel illustrated in FIG. 1 taken along a section line A-A'. As shown in FIGS. 1 and 2, the display panel includes a substrate 10 and a pixel array 100 disposed on the substrate 10. The pixel array 100 includes a plurality of pixels 110. The pixel 110 includes a plurality of sub-pixels (FIGS. 1 and 2 exemplarily illustrate that the pixel 110 includes a red sub-pixel 120R, a green sub-pixel 120G, and a blue sub-pixel 120B). The sub-pixel includes a driving circuit layer 20, an uneven surface layer 30, and a light-emitting layer 40 stacked in manufacture processing sequence. The uneven surface layer 30 includes a plurality of concave-convex structures 310. Therein at least two sub-pixels in each pixel 110 emit light in different colors, and possess different numbers of concave-convex structures 310, and the sub-pixels with a same color in the pixel array 100 possess a same number of concave-convex structures 310.

As shown in FIGS. 1 and 2, the uneven surface layer 30 is disposed in the sub-pixels of different colors and includes the concave-convex structures 310, so that when the light-emitting layer 40 is formed on the uneven surface layer 30, an effective light-emitting area of the light-emitting layer 40 formed on the uneven surface layer 30 increases due to the existence of the concave-convex structures 310. For a high resolution display panel, wherein a sub-pixel has relatively smaller area, adding the uneven surface layer 30 underneath the light-emitting layer will help the high resolution display maintain high brightness. Furthermore, the numbers of concave-convex structures in different sub-pixels can be varied as an unique approach to compensate color shift or white balance on a display image, or to solve other color related issues, such as different life-time of light-emitting materials, or different transmittance spectrum in color filter layers, or different color sensitivity of human vision systems.

As shown in FIG. 2, the surface profile of light-emitting layer 40 is exactly the same as the surface profile of the uneven surface layer 30. In a practical manufacture process, the surface profile of the light-emitting layer 40 formed on the uneven surface layer 30 may be slightly different from the surface profile of the uneven surface layer 30. In consideration of an error in the manufacture process, it is merely necessary to ensure that the formed light-emitting layer 40 has an approximately same surface profile as the uneven surface layer 30.

According to the display panel provided in the embodiments of the present disclosure, each of the plurality of sub-pixels of different colors includes the driving circuit layer, the uneven surface layer, and the light-emitting layer stacked in sequence, the uneven surface layer includes the plurality of concave-convex structures, and at least two sub-pixels possess different numbers of concave-convex structures. By configuring concave-convex structures in the uneven surface layer of the plurality of sub-pixels of different colors, the light-emitting area of the display panel is increased, and the brightness of the light-emitting layers is enhanced.

For the sub-pixels of different colors, since different light-emitting materials of sub-pixels have different life time, the attenuation rates of the light-emitting layers in the sub-pixels of different colors are different. When the light-emitting layer 40 is manufactured by using materials having different light-emitting colors, the light intensities of sub-pixels of different colors decay in time at different rates. For example, the blue sub-pixel has a faster attenuation under the same current density. Therefore, in order to achieve a certain brightness, the effective light-emitting area of the blue sub-pixel 120B is increased, so that the current density can be reduced with the total current remains unchanged, and the life time is increased to match with long-life light-emitting materials of other colors. That is, it may be configured that the greater the attenuation rate of the light-emitting layer 40 in a sub-pixel, the larger the number of concave-convex structures 310 in the sub-pixel.

Figure 3:
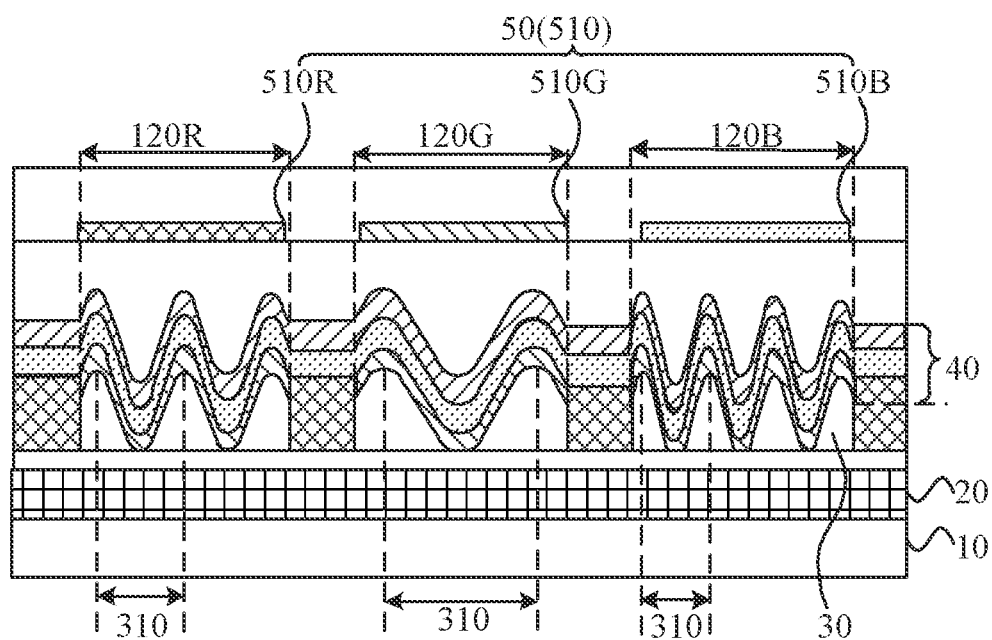
FIG. 3 illustrates a cross-sectional view of a display panel according to embodiments of the present disclosure.

For another example, as shown in FIG. 3, each of the plurality of sub-pixels further includes a color filter layer 50 disposed on the light-emitting layer 40, which emits white light. Since portions of the color filter layer 50 corresponding to the sub-pixels of different colors have different transmittances, the color deviation problem may occur in the display panel. Therefore, in the embodiments of the present disclosure, it may further be configured that the lower the transmittance of the color filter layer 50 in a sub-pixel, the larger the number of concave-convex structures 310 in the sub-pixel.

The human vision system has different sensitivity to different colors, for example, it is most sensitive to green and least sensitive to blue. Therefore, it is sometimes desirable, for the purpose of white balance, to adjust the relative brightness of green tone in an image by making less concave-convex structures in the green sub-pixel, or vice versa, making more concave-convex structures in the blue sub-pixel.

According to the structure of human retina, the spatial resolution is mainly determined by green and red pixels. In order to provide higher resolution for the display panel, the number of blue sub-pixels may be reduced and the number of green sub-pixels may be increased. That is, the number of blue sub-pixels is smaller than that of green sub-pixels in the display panel. However, if sub-pixels of all colors emit the same number of photons, the blue sub-pixel may have a very low brightness due to the fact that the number of blue sub-pixels is small. Therefore, it may be configured that the smaller the number of sub-pixels, the larger the number of concave-convex structures in the sub-pixel.

Figure 4:
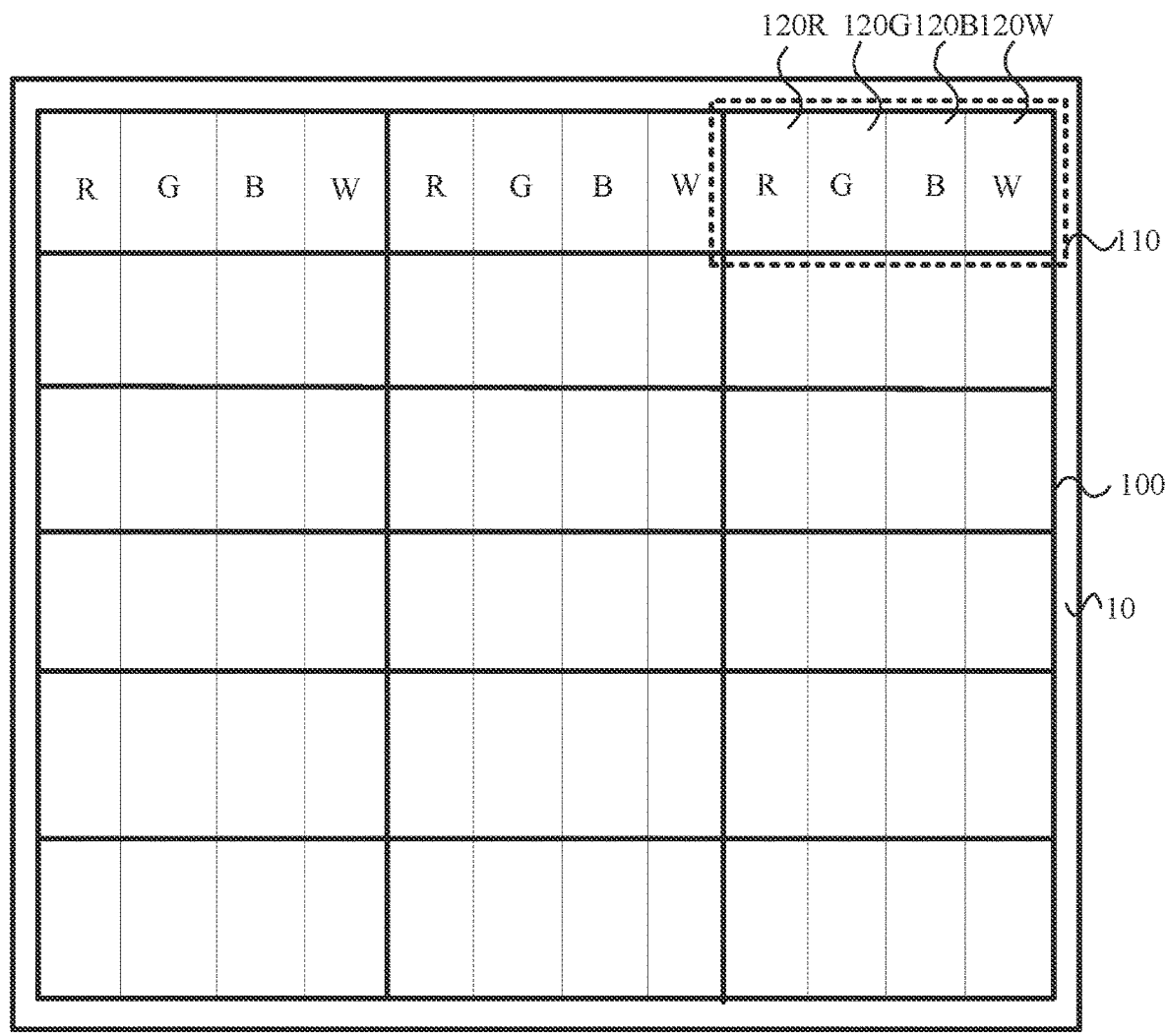
FIG. 4 shows a plane view of another display panel according to embodiments of the present disclosure.

Optionally, as shown in FIG. 1, the pixel 110 includes the red sub-pixel 120R, the green sub-pixel 120G, and the blue sub-pixel 120B. Alternatively, as shown in FIG. 4, the pixel 110 includes the red sub-pixel 120R, the green sub-pixel 120G, the blue sub-pixel 120B, and a white sub-pixel 120W.

It is to be noted that each pixel 110 in the pixel array 100 in the display panel may include the red sub-pixel 120R, the green sub-pixel 120G, and the blue sub-pixel 120B, or include the red sub-pixel 120R, the green sub-pixel 120G, the blue sub-pixel 120B, and the white sub-pixel 120W.

Furthermore, FIGS. 1 and 2 exemplarily illustrate that the pixel 110 includes the red sub-pixel 120R, the green sub-pixel 120G, and the blue sub-pixel 120B. In other implementations, colors of sub-pixels and the number of sub-pixels included in the pixel 110 may be selected according to design requirements of the display panel. The colors of sub-pixels, the number of sub-pixels, and an arrangement of the sub-pixels in the pixel 110 are not limited in the embodiments of the present disclosure.

Optionally, still referring to FIG. 2, the green sub-pixel 120G has the smallest number of concave-convex structures 310.

According to the retina structure of the human vision system, the human vision system has different sensitivity to different colors, and is most sensitive to green. When sub-pixels of different colors in the pixel 110 are configured to possess the same number of concave-convex structures 310, the number of photons emitted from the sub-pixels of different colors emit is the same. Since the spatial resolution of the display panel observed by the human vision system is mainly determined by green sub-pixels and red sub-pixels and the human vision system is most sensitive to green, the abnormal display problem will occur in the display panel. In order to solve this problem, the light-emitting brightness of the green sub-pixel 120G can be reduced by setting the green sub-pixel 120G to have the smallest number of concave-convex structures 310, so that the problem of brightness difference between sub-pixels of different colors caused the sensitivity of the human vision system may be avoided.

Still referring to FIG. 2, the green sub-pixel 120G has concave-convex structures 310 less than the red sub-pixel 120R does, and the number of concave-convex structures 310 in the red sub-pixel 120R has concave-convex structures 310 less than the blue sub-pixel 120B does.

As shown in FIG. 2, the pixel 110 includes the red sub-pixel 120R, the green sub-pixel 120G, and the blue sub-pixel 120B. Since the light-emitting materials of different colors driven by the same voltage or current have different light-emitting efficiencies and deterioration rates, the luminous flux of light emitted from the light-emitting materials and the attenuation rates of the luminous flux are not the same. The deteriorations rates of the light-emitting materials in the blue sub-pixel 120B, the red sub-pixel 120R, and the green sub-pixel 120G sequentially decrease, and the sensitivity of the human vision system to the blue sub-pixel 120B, the red sub-pixel 120R, and the green sub-pixel 120G sequentially increase. Therefore, the green sub-pixel 120G can be set to have a smaller number of concave-convex structures 310 than the red sub-pixel 120R and the blue sub-pixel 120B. That is, the effective light-emitting area of the green sub-pixel 120G is reduced, so that uniformity of the brightness of the sub-pixels of different colors in the display panel may be ensured.

Optionally, white sub-pixel has the most concave-convex structures 310.

When the pixel 110 of the display panel includes the red sub-pixel 120R, the green sub-pixel 120G, the blue sub-pixel 120B and the white sub-pixel 120W, the white sub-pixel may be configured to have the most concave-convex structures 310, thereby improving the brightness of the display panel. The white sub-pixel is to improve the brightness of the display panel, but may reduce color saturation and the space of red (R), green (G), and blue (B) sub-pixels. Therefore, if a certain brightness can be maintained and the space occupied by the white sub-pixel 120W is reduced, the area of R, G, and B sub-pixels can be appropriately increased. Therefore, in the embodiments of the present disclosure, the white sub-pixel 120W is configured to have the most concave-convex structures 310, so that the space occupied by the white sub-pixel is reduced, improving the brightness of the display panel, and ensuring the color saturation of the display panel.

Optionally, the driving voltage of a light-emitting layer in a sub-pixel is inversely proportional to the number of concave-convex structures 310 underneath the light-emitting layer 40.

The driving circuit of the pixel in the display panel includes at least one driving transistor connected in series with the light-emitting layer. The equivalent series resistance of the driving transistor is changed by adjusting the gate of the driving transistor, so that a voltage consumed across the driving transistor is changed. For an applied voltage of a same magnitude, a voltage applied across the light-emitting layer 40 may be changed. The driving voltage of the light-emitting layer 40 in a sub-pixel is inversely proportional to the number of concave-convex structures 310 underneath the light-emitting layer 40, thereby ensuring that sub-pixels of different colors emit the same number of photons and improving the display effect of the display panel. Therefore, when there are more concave-convex structures 310 in the region where the sub-pixel is located, the driving voltage of the light-emitting layer 40 of the sub-pixel may be configured to be lower to ensure that the number of photons emitted from the sub-pixels of different colors remains unchanged.

It is to be noted that a relationship between a gate voltage of the driving transistor and the driving voltage of the light-emitting layer may be adjusted according to whether the driving circuit of the pixel adopts an NMOS or a PMOS and polarity of VDD.

Furthermore, on the premise that the light-emitting layer 40 of the sub-pixels emit the same number of photons, the light-emitting layer 40 with more concave-convex structures 310 may have the slightly lower driving voltage due to a larger effective light-emitting area. Although the photon amount per unit area decreases due to a decrease in the driving voltage, an increase in the light-emitting area can compensate for the decrease in the driving voltage, thereby ensuring that the number of photons emitted from the sub-pixels of different colors remains unchanged. A conventional approach to change photon number emitted from a sub-pixel, is to adjust the driving voltage and perhaps the sub-pixel dimension. The present disclosure provides another approach of changing brightness of sub-pixels of different colors by varying the number of concave-convex structures in the sub-pixels of the different colors, which increases color gamut of a display picture.

Optionally, as shown in FIG. 3, the pixel further includes the color filter layer 50 disposed on the light-emitting layer 40, the color filter layer 50 includes color filter structures 510 (FIG. 3 exemplarily illustrates that the color filter structures 510 include a red color filter structure 510R, a green color filter structure 510G, and a blue color filter structure 510B) arranged in an array, and color filter structures include color filters in different colors, corresponding to the sub-pixels.

Optionally, as shown in FIG. 2, instead of using color filters to create various colors from a white light, at least two light-emitting layers 40 associated with two sub-pixels in each of the plurality of pixels emit light in different colors from the first place.

In addition, to enhance the color gamut or to further make tuning in light spectral, a color filter layer 50 can be disposed on the light-emitting layer 40 which emits light in different colors.

Figure 5A:
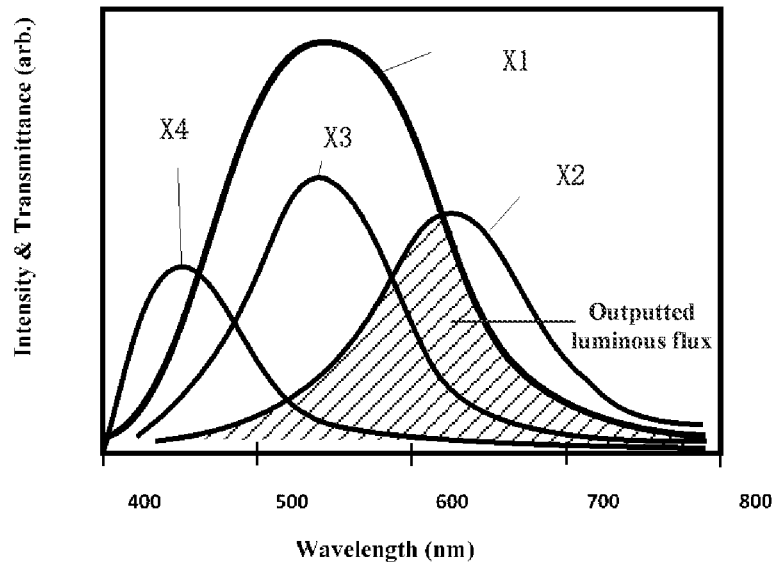
FIG. 5A schematically illustrates OLED emission spectral and three transmission spectrum in R, G, B color filters respectively.

In a white light plus color filter combination, since different color filter structures 510 have different transmittances for the white light, sub-pixel brightness after color filter may not be in a desirable level. As illustrated in FIG. 5A, curve X1 represents a spectral curve of the light-emitting element of the display panel, and the transmittance of the color filter in different colors is represented by X2, X3, and X4, respectively. X2 represents a transmittance curve of red color filter structure 510R, X3 represents a transmittance curve of green color filter structure 510G, and X4 represents a transmittance curve of blue color filter structure 510B. The overlapping area between the transmittance curve X2 and the white spectral curve X1 represents the luminous flux that may be actually outputted. As illustrated in FIG. 5A, output photon flux after the different color filters are different, for a same driving voltage, the color shift may occur in the display images. In order to overcome the color shift, it is reasonable to change the driving voltage of each sub-pixel for color compensation. However, those adjustments to the driving voltage of the pixel may affect the dynamic range.

Figure 5B:
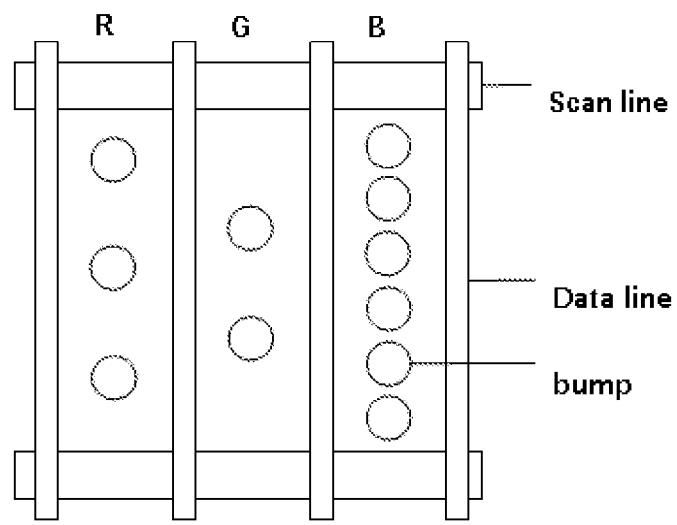
FIG. 5B illustrates the arrangement of concave-convex structures in an pixel array of the display panel according to embodiments of the present disclosure.

FIG. 5B illustrates the arrangement of concave-convex structures in a pixel array of the display panel according to the embodiments of the present disclosure. As shown in FIG. 5B, the sub-pixels of the different colors are configured to have different numbers of the concave-convex structures (represented as circles in FIG. 5B). By adjusting the number of concave-convex structure structures 310 per unit area, and equivalently adjusting effective light-emitting areas in different sub-pixels, can bring the display brightness and color gamut to a desirable status, without or with minor adjustment in driving voltages.

Figure 6:
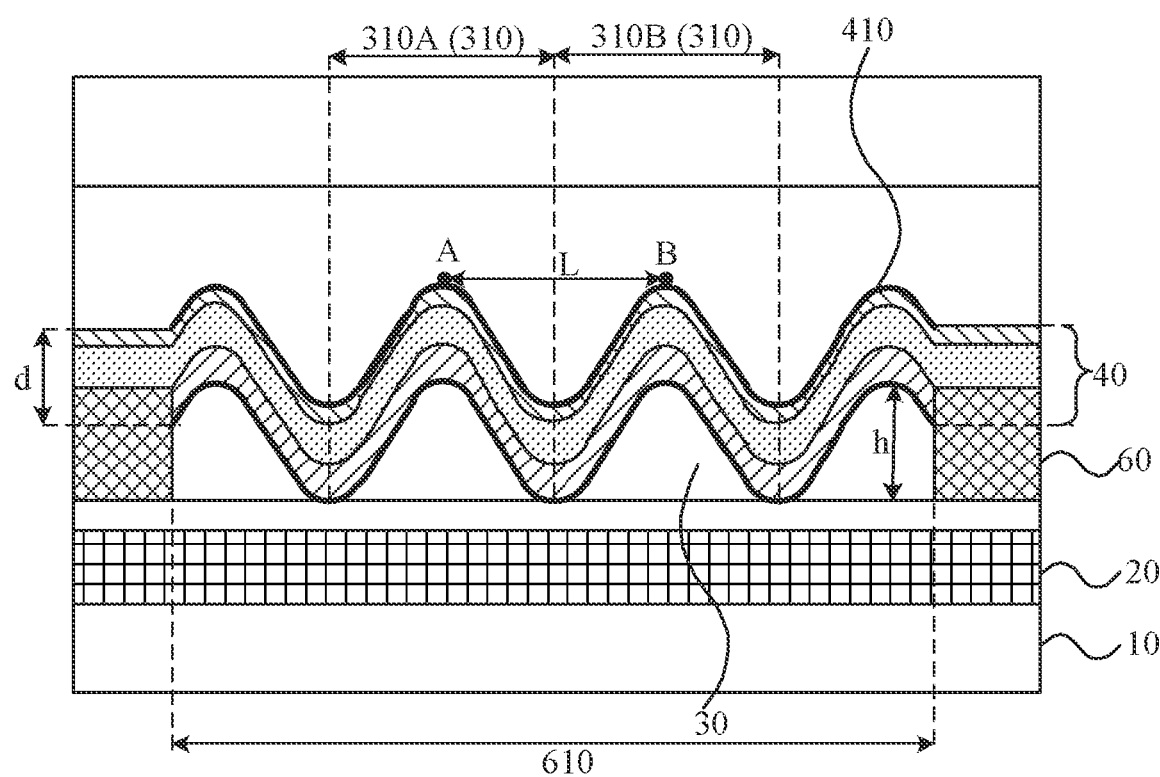
FIG. 6 illustrates cross-sectional view of a sub-pixel according to embodiments of the present disclosure.

FIG. 6 illustrates a cross-sectional view of a sub-pixel according to embodiments of the present disclosure. As shown in FIG. 6, the display panel further includes a pixel definition layer 60 having a plurality of opening regions 610, and the pixel definition layer 60 is disposed on the side of the uneven surface layer 30 facing away from the substrate 10. The concave-convex structure 310 is disposed in the opening region 610.

As shown in FIG. 2, the concave-convex structure 310 is disposed in the opening region 610 of the pixel definition layer 60, then the light-emitting layer 40 is conformally laminated on the concave-convex structure 310, so that the light-emitting surface exhibits a resemble surface topology as the concave-convex structure. Therefore effective light-emitting area within each pixel increases and the display brightness increases accordingly.

Optionally, still referring to FIG. 6, protrusion height h, which represents a maximum height variation of the concave-convex structure 310, is greater than the thickness d of the light-emitting layer 40.

The surface topology of the light-emitting element depends on manufacture process as well. In manufacturing an OLED display panel according to present disclosure, where the OLED film is deposited on the uneven surface layer through thermal evaporation, the applicant found that the protrusion height of the uneven OLED light-emitting surface is preferred to be larger than the OLED film thickness so to gain a significant boost in display brightness. Assume the surface protrusion height is denoted by h, the light-emitting layer thickness is denoted by d, it is therefore preferred to realize h≥d after OLED film evaporation.

As shown in FIG. 6, a horizontal distance from point A to point B, denoted by L, represents a period of the periodically repeated protrusions in the concave-convex structure 310B. It is preferred to make the period of the concave-convex structure larger than two folds of the OLED film thickness, i.e. L≥2d, so that the OLED film on the two adjacent protrusions are kept spatially separated no matter how thick it is. The multilayer OLED film, including anode metal and cathode metal, will inevitably have some internal stress after it is deposited on the concave-convex surface. Film cracking may occur when internal mechanical stress is too high, especially when environment temperature changes abruptly. Keeping the above relationship that L≥2d, will have relaxation effect in the OLED film so to reduce the risk of film cracking.

The surface shapes of the concave-convex structure can be in various curvatures, subject to both mask design and photolithograph process. To balance the performance and the reliability of the OLED light-emitting element, periodically repeated trapezoidal shape and sine wave shape are among the most preferred options. As shown in FIG. 6, the surface profile of the concave-convex structures 310 is made in a sine wave shape.

Optionally, still referring to FIG. 6, a height-to-width ratio, defined by a ratio of the protrusion height h to a horizontal distance L from the point A to point B is preferred to be in the range from 0.3 to 2.0, i.g.

$$0.3 \leq \frac{h}{L} \leq 2.$$

As shown in FIG. 6, when the surface profile of the concave-convex structures 310 manifests in the sine wave shape, a function of the surface profile of the concave-convex structures 310 is configured to satisfy:

$$Y(x) = \frac{h}{2}\left(1 + \cos\left(\frac{2\pi}{L}x\right)\right). \quad (1)$$

The function in formula (1) is derived to obtain an inclination angle $\theta_m$ of a maximum slope of the surface profile of the concave-convex structures 310 which satisfies:

$$\theta_m = \arctan\left(\frac{\pi h}{L}\right). \quad (2)$$

Here h still, represents the protrusion height in the sine waveform surface profile, and L still, represents the horizontal distance between two adjacent protrusions in the sine waveform surface profile.

$$\frac{h}{L}$$

When the inclination angle $\theta_m$ is selected as 75°, the height-to-width ratio is calculated as 1.19 according to the formula (2). The applicant has found that when the height-to-width ratio ranges from 0.3 to 2.0, and therefore the inclination angle $\theta_m$ ranges between 43° and 81°, the effective light-emitting area of the light-emitting layer 40 increases significantly while risks of cracking in the light-emitting layer 40 is negligible. It is therefore preferred to make the height-to-width ratio in the range from 0.3 to 2.0.

Though the above preference in making surface topology of the concave-concave structure 310 is concluded from a sine wave surface profile, it is perhaps applicable to other surface profiles as well.

Optionally, a minimum radius of curvature ρ of the concave-convex structures in the uneven surface layer 30 satisfies that:

$$\rho \geq \frac{d}{2}.$$

d denotes the thickness of the light-emitting layer 40.

In an example, when the surface profile of the concave-convex structures 310 manifests in the sine wave shape and satisfies the formula (1), an expression of a radius of curvature at a peak position (i.e., the protrusion of the concave-convex structure) of the surface of the concave-convex structure 310 can be solved and satisfies that:

$$\rho = \frac{L^2}{2\pi^2 h}. \quad (3)$$

Since the radius of curvature at the protrusion of the concave-convex structure 310 is the smallest, the light-emitting layer 40 evaporated on the concave-convex structure 310 is subject to the largest internal strain, and cracking may easily occur in the concave-convex structure 310. To avoid the cracking of the light-emitting layer 40 caused by the internal strain of the light-emitting layer 40, the minimum radius of curvature ρ of the concave-convex structure 310 and the light-emitting layer thickness d are configured to satisfy that $$\rho \geq \frac{d}{2},$$

that is, $$\frac{L^2}{2\pi^2 h} \geq \frac{d}{2}.$$

For example, when the light-emitting layer thickness d is configured to 100 nm, and the horizontal distance L between adjacent protrusions of concave-convex structures 310 is configured to 1000 nm, a value range of h can be obtained according to $$\frac{L^2}{2\pi^2 h} \geq \frac{d}{2} \text{ and } 0.3 \leq \frac{h}{L} \leq 2,$$

and then the concave-convex structure in the uneven surface layer is determined.

Furthermore, it is derived from formulas (1) to (3) that an increase ratio of the effective light-emitting area, hereafter denoted by RP, after adding the uneven surface layer 30 can be described by a formula:

$$RP = \frac{2}{\pi^2} \cdot \int_0^\pi t\left(\sqrt{1 + \left(\frac{\pi h}{L}\right)^2 \sin^2(t)}\right) dt. \quad (4)$$

Figure 7:
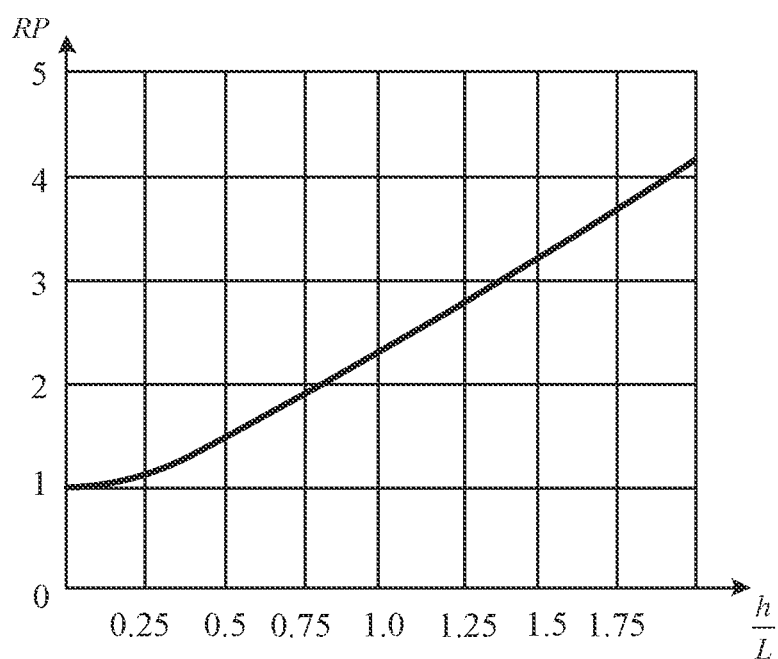
FIG. 7 shows a plot of simulation results for enhancement in effective light emitting area.

Computation of RP value for a parameter of the height-to-width ratio is performed, and the results are plotted in FIG. 7. As shown in FIG. 7, when the height-to-width ratio is equal to 1, the effective light-emitting area is increased by 2.2 fold, and similar boosts in light output in the display panel is expected as well.

It is to be noted that the above embodiments are described by taking the surface profile of the concave-convex structures 310 which manifests in the sine wave shape as an example. However, in practical product production, due to manufacture process differences and other reasons, the beneficial effects of the present disclosure can be achieved within a certain size error range. For example, when the surface profile of the concave-convex structures 310 is approximately in the sine wave shape or approximates to the sine wave shape. Therefore, a concave-convex curved surface which is approximately in the sine wave shape or approximates to the sine wave shape is within the scope of the present disclosure.

Figure 8:
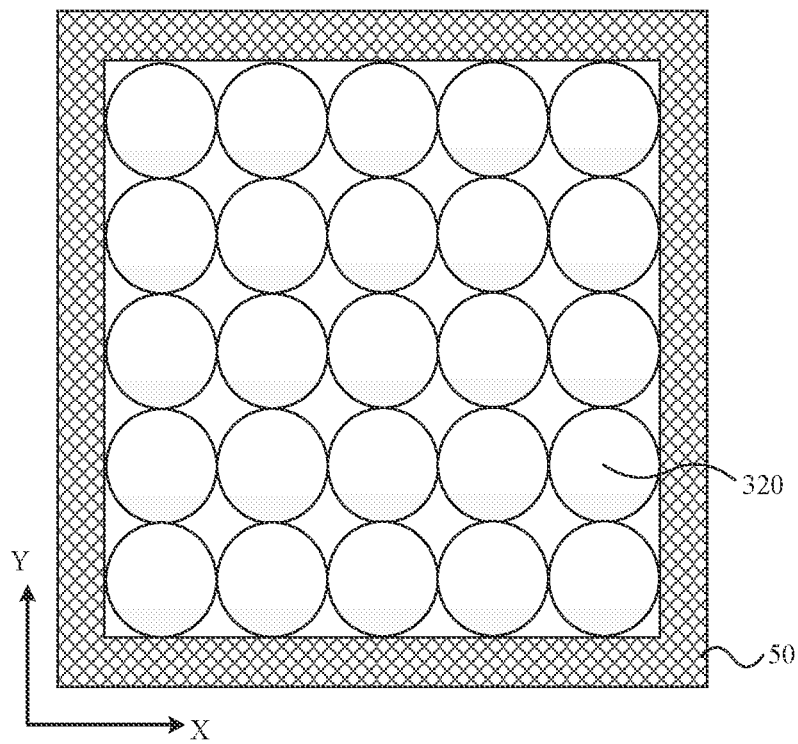
FIG. 8 shows a plane view of another display panel according to embodiments of the present disclosure.

Optionally, the plurality of concave-convex structures 310 are arranged in a first direction X and a second direction Y, the first direction X and the second direction Y are intersect each other in 90 degree or in 60 degree. The first direction X is perpendicular to the second direction Y, as shown in FIG. 8. Alternatively, an included angle between the first direction X and the second direction Y is 60°, as shown in FIG. 9.

As shown in FIG. 8, when the concave-convex structures 310 are arranged in the first direction X and the second direction Y, the first direction X is perpendicular to the second direction Y, and a plurality of sub-pixels of different colors are arranged in a regular rectangle, the edges of the concave-convex structures 310 arranged in an array in the first direction X and the second direction Y are consistent with the edges of the sub-pixels.

Figure 9:
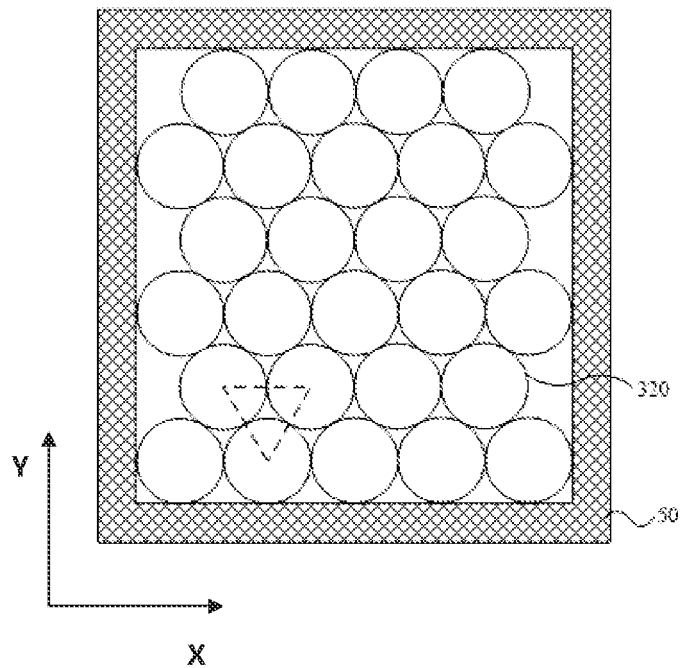
FIG. 9 shows a plane view of another display panel according to embodiments of the present disclosure.

As shown in FIG. 9, when the concave-convex structures 310 are arranged in the first direction X and the second direction Y, and the included angle between the first direction X and the second direction Y is 60°, the concave-convex structures 310 of the uneven surface layer 30 are arranged in a triangle as shown in FIG. 4. As can be seen from FIG. 9, the concave-convex structures 310 arranged in a triangle may effectively increase the light-emitting surface of the light-emitting layer 40, improving the brightness of the display panel.

It is to be noted that FIG. 9 exemplarily illustrates that the included angle between the first direction X and the second direction Y is 60°. In the practical production and preparation process, the concave-convex structures 310 cannot be arranged completely with the included angle between the first direction X and the second direction Y being 60°, and a certain angle deviation may exist. The concave-convex structures 310 of the uneven surface layer 30 can be arranged in a triangle as shown in FIG. 9 as long as the included angle between the first direction X and the second direction Y is within the range of about 60°.

It is to be noted that FIGS. 8 and 9 exemplarily illustrate two types of arrangement of concave-convex structures 310. In the specific preparation process of the display panel, those skilled in the art can make design according to a specific structure of the display panel. The specific arrangement of the concave-convex structures 310 is not limited in the embodiments of the present disclosure.

It is to be noted that the above are merely several preferred embodiments conceived by the inventor according to the disclosed concept when filing the present application. Those skilled in the art can make various apparent modifications, adaptations, combinations, or substitutions without departing from the scope of the present disclosure. Therefore, while the present disclosure has been described in detail through the above embodiments, the present disclosure is not limited to the above embodiments and may further include more other equivalent embodiments without departing from the concept and idea of the present disclosure as set forth in the following claims.

What is claimed is:

1. A display panel, comprising:
   a substrate; and
   a pixel array on the substrate, the pixel array comprising a plurality of pixels, wherein
   each of the plurality of pixels comprises a plurality of sub-pixels, and each of the plurality of sub-pixels comprises a driving circuit layer, an uneven surface layer, and a light-emitting layer, which are stacked in manufacture processing sequence;
   the uneven surface layer comprises a plurality of concave-convex structures;
   at least two sub-pixels in each of the plurality of pixels emit light in different colors, and possess different numbers of concave-convex structures;
   the sub-pixels with a same color in the pixel array possess a same number of concave-convex structures;
   the display panel further comprises a pixel definition layer including a plurality of opening regions, the pixel definition layer is on one side of the uneven surface layer opposite from the substrate, and the concave-convex structures are in the plurality of opening regions; and
   a maximum height variation of the concave-convex structure h, is greater than a thickness of the light-emitting layer d.

2. The display panel of claim 1, wherein each of the plurality of pixels comprises a red sub-pixel, a green sub-pixel, and a blue sub-pixel; or each of the plurality of pixels comprises a red sub-pixel, a green sub-pixel, a blue sub-pixel, and a white sub-pixel.

3. The display panel of claim 2, wherein the green sub-pixel has a least number of concave-convex structures.

4. The display panel of claim 2, wherein the green sub-pixel has less concave-convex structures than the red sub-pixel does, and the red sub-pixel has less concave-convex structures than the blue sub-pixel does.

5. The display panel of claim 2, wherein the white sub-pixel has a most number of concave-convex structures.

6. The display panel of claim 1, wherein a driving voltage of a light-emitting layer in a sub-pixel is inversely proportional to a number of the concave-convex structures underneath the light emitting layer.

7. The display panel of claim 1, wherein each of the plurality of sub-pixels further comprises a color filter layer on the light-emitting layer, and each of the plurality of sub-pixels emits white light.

8. The display panel of claim 1, wherein at least two light-emitting layers associated with two sub-pixels in each of the plurality of pixels, emit light in different colors.

9. The display panel of claim 1, wherein a distance between two adjacent protrusions of the concave-convex structures L, satisfies:

$$L \geq 2d;$$

wherein d is a thickness of the light-emitting layer.

10. The display panel of claim 1, wherein a surface profile of the plurality of concave-convex structures manifests in a sine wave shape.

11. The display panel of claim 1, wherein a maximum height variation of the concave-convex structures h, satisfies:

$$0.3 \leq \frac{h}{L} \leq 2.$$

12. The display panel of claim 1, wherein a minimum radius of curvature $\rho$ of the plurality of concave-convex structures satisfies:

$$\rho \geq \frac{d}{2};$$

wherein d denotes a thickness of the light-emitting element layer.

13. The display panel of claim 1, wherein the plurality of concave-convex structures are arranged in a first direction and a second direction, that intersect each other at 90 degrees or at 60 degrees.

* * * * *